(12) United States Patent
Kamtekar et al.

(10) Patent No.: US 9,963,550 B2
(45) Date of Patent: May 8, 2018

(54) POLYMERS AND ORGANIC ELECTRONIC DEVICE

(71) Applicants: Cambridge Display Technology Limited, Godmanchester (GB); Sumitomo Chemical Co., Ltd., Tokyo (JP)

(72) Inventors: Kiran Kamtekar, Godmanchester (GB); Annette Steudel, Dresden (DE); Martin Humphries, Godmanchester (GB)

(73) Assignees: Cambridge Display Technology Limited, Cambridgeshire (GB); Sumitomo Chemical Company Limited, Tokyo (JP)

( * ) Notice: Subject to any disclaimer, the term of this patent is extended or adjusted under 35 U.S.C. 154(b) by 324 days.

(21) Appl. No.: 14/674,277

(22) Filed: Mar. 31, 2015

(65) Prior Publication Data

US 2015/0274890 A1 Oct. 1, 2015

(30) Foreign Application Priority Data

Mar. 31, 2014 (GB) .................................. 1405769.9

(51) Int. Cl.
| | | |
|---|---|---|
| *C08G 73/00* | (2006.01) | |
| *C08G 73/02* | (2006.01) | |
| *H01L 51/00* | (2006.01) | |
| *C08G 61/12* | (2006.01) | |
| *H01L 51/50* | (2006.01) | |

(52) U.S. Cl.
CPC .......... *C08G 73/026* (2013.01); *C08G 61/12* (2013.01); *H01L 51/0039* (2013.01); *H01L 51/0043* (2013.01); *C08G 2261/135* (2013.01); *C08G 2261/1414* (2013.01); *C08G 2261/3142* (2013.01); *C08G 2261/3162* (2013.01); *C08G 2261/411* (2013.01); *C08G 2261/512* (2013.01); *C08G 2261/95* (2013.01); *H01L 51/5056* (2013.01); *H01L 2251/308* (2013.01)

(58) Field of Classification Search
CPC ........ C08G 2261/3162; C08G 2261/76; C08G 2261/95; C08L 79/02; H01L 51/0039
USPC ........................................................ 528/422
See application file for complete search history.

(56) References Cited

U.S. PATENT DOCUMENTS

| | | |
|---|---|---|
| 2001/0026878 A1 | 10/2001 | Woo et al. |
| 2006/0154384 A1 | 7/2006 | Murphy et al. |
| 2008/0097076 A1* | 4/2008 | Radu ..................... C08G 61/02 528/422 |
| 2013/0284984 A1 | 10/2013 | Newsome et al. |

FOREIGN PATENT DOCUMENTS

| | | |
|---|---|---|
| GB | 2483629 A | 3/2012 |
| GB | 2484054 A | 3/2012 |
| WO | WO 03/095586 A1 | 11/2003 |
| WO | WO 2013/108023 A1 | 7/2013 |
| WO | WO 2015/028768 A1 | 3/2015 |

OTHER PUBLICATIONS

Examination Report dated Sep. 8, 2016 for Application No. GB1405769.9.
Combined Search and Examination Report for Great Britain Application No. 1405769.9, dated Sep. 24, 2014, pp. 1-7.

* cited by examiner

*Primary Examiner* — Shane Fang
(74) *Attorney, Agent, or Firm* — Wolf, Greenfield & Sacks, P.C.

(57) ABSTRACT

A polymer comprising repeat units of formula (I) and repeat units of formula (II):

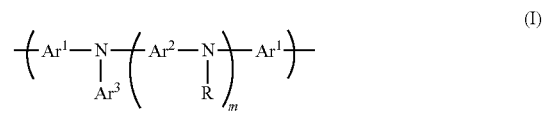

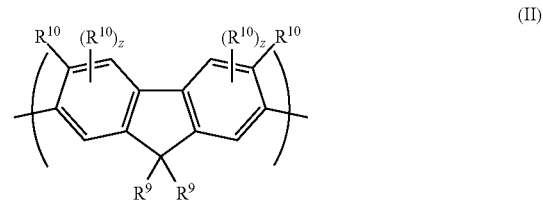

wherein:
$Ar^1$ and $Ar^2$ independently in each occurrence represents an aryl or heteroaryl group that may be unsubstituted or substituted with one or more substituents; $Ar^3$ represents a fused aromatic or heteroaromatic group that may be unsubstituted or substituted with one or more substituents; R is a substituent; m is 0, 1 or 2 with the proviso that $Ar^2$ is not phenanthrene if m is 1; each $R^9$ is independently a substituent, and the two groups $R^9$ may be linked to form a ring; each z is independently 0, 1 or 2; and each $R^{10}$ is independently a substituent. The polymer may be used in an organic light-emitting device.

22 Claims, 2 Drawing Sheets

POLYMERS AND ORGANIC ELECTRONIC DEVICE

RELATED APPLICATIONS

This application claims foreign priority benefits under 35 U.S.C. § 119(a)-(d) or U.S.C. § 365(b) of British application number GB1405769.9, filed Mar. 31, 2014, the entirety of which is herein incorporated by reference.

BACKGROUND OF THE INVENTION

Electronic devices containing active organic materials are attracting increasing attention for use in devices such as organic light emitting diodes (OLEDs), organic photoresponsive devices (in particular organic photovoltaic devices and organic photosensors), organic transistors and memory array devices. Devices containing active organic materials offer benefits such as low weight, low power consumption and flexibility. Moreover, use of soluble organic materials allows use of solution processing in device manufacture, for example inkjet printing or spin-coating.

An OLED may comprise a substrate carrying an anode, a cathode and one or more organic light-emitting layers between the anode and cathode.

Holes are injected into the device through the anode and electrons are injected through the cathode during operation of the device. Holes in the highest occupied molecular orbital (HOMO) and electrons in the lowest unoccupied molecular orbital (LUMO) of a light-emitting material combine to form an exciton that releases its energy as light.

Suitable light-emitting materials include small molecule, polymeric and dendrimeric materials. Suitable light-emitting polymers include poly(arylene vinylenes) such as poly (p-phenylene vinylenes) and polyarylenes such as polyfluorenes.

A light emitting layer may comprise a semiconducting host material and a light-emitting dopant wherein energy is transferred from the host material to the light-emitting dopant. For example, J. Appl. Phys. 65, 3610, 1989 discloses a host material doped with a fluorescent light-emitting dopant (that is, a light-emitting material in which light is emitted via decay of a singlet exciton).

Phosphorescent dopants are also known (that is, a light-emitting dopant in which light is emitted via decay of a triplet exciton).

A hole-transporting layer may be provided between the anode and light-emitting layer of an OLED.

JP 2010/062442 discloses polymers of the following structure:

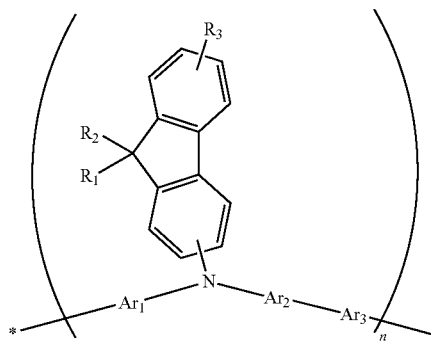

WO 2004/037887 discloses polymers containing repeat units including amine repeat units substituted with an aryl or heteroaryl systems of at least two condensed rings.

WO 2006/091799 discloses polymers comprising repeat units of the following formula:

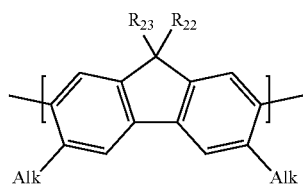

wherein Alk is an optionally fluoro-substituted alkyl group and R22 and R23 are each independently selected from the group consisting of alkyl, substituted alkyl, aryl, substituted aryl, heteroaryl, and substituted heteroaryl.

SUMMARY OF THE INVENTION

In a first aspect the invention provides a polymer comprising repeat units of formula (I) and repeat units of formula (II):

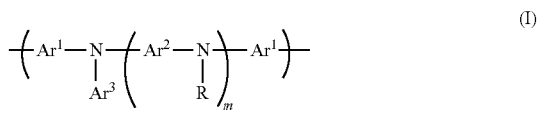

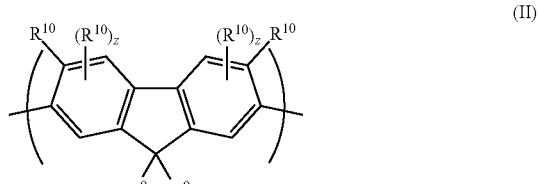

wherein:
$Ar^1$ and $Ar^2$ independently in each occurrence represents an aryl or heteroaryl group that may be unsubstituted or substituted with one or more substituents; $Ar^3$ represents a fused aromatic or heteroaromatic group that may be unsubstituted or substituted with one or more substituents; R is a substituent; m is 0, 1 or 2 with the proviso that $Ar^2$ is not phenanthrene if m is 1; each $R^9$ is independently a substituent, and the two groups $R^9$ may be linked to form a ring; each z is independently 0, 1 or 2; and each $R^{10}$ is independently a substituent.

In a second aspect the invention provides an organic electronic device comprising a layer comprising a polymer according to the first aspect. Optionally, the device is an organic light-emitting device and the layer is provided between an anode and cathode of the organic light-emitting device.

In a third aspect the invention provides a formulation comprising a polymer according to the first aspect and at least one solvent.

In a fourth aspect the invention provides a method of forming an organic light-emitting device according to the second aspect, the method comprising the steps of: forming a layer comprising a polymer according to the first aspect over the anode, and forming the cathode over the layer.

"Aryl" and "heteroaryl" as used herein includes monocyclic or fused aryl and monocyclic or fused heteroaryl.

DESCRIPTION OF THE DRAWINGS

The invention will now be described in more detail with reference to the drawings, in which.

DETAILED DESCRIPTION OF THE INVENTION

Figure 1:
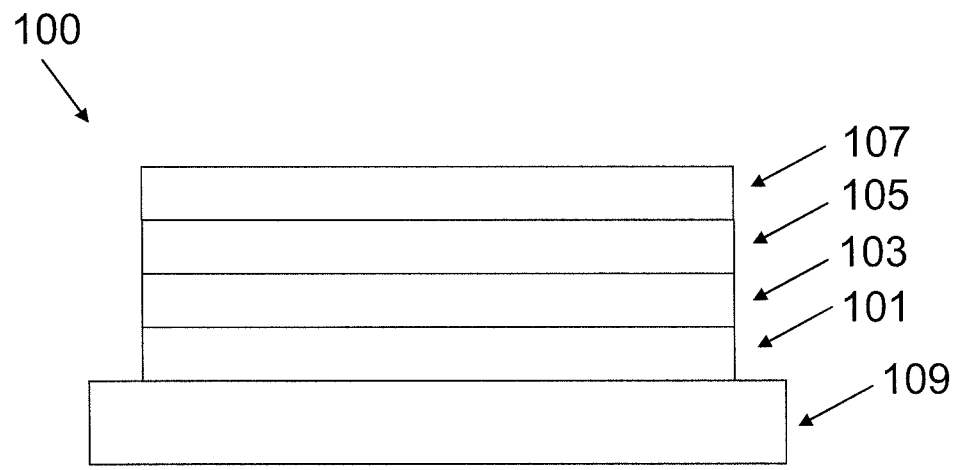
FIG. 1 illustrates an OLED according to an embodiment of the invention.

With reference to FIG. 1, an OLED 100 according to an embodiment of the invention has an anode 101, a cathode 107, a light-emitting layer 105 between the anode and the cathode, and a hole-transporting layer 103 between the anode 101 and the light-emitting layer 105. The device is supported on a substrate 109, which may be a glass or plastic substrate. Hole-transporting layer 103 contains a polymer comprising repeat units of formulae (I) and (II).

One or more further layers may be provided between the anode and the cathode, for example a hole-injection layer, an electron-blocking layer, an electron-transporting layer or an electron blocking layer. In a preferred embodiment, a hole-injection layer is provided between the anode and the hole-transporting layer. Where present, the hole-injection layer is preferably adjacent to the hole-transporting layer. Preferably, the hole-transporting layer is adjacent to the light-emitting layer.

Light-emitting layer 105 may contain one or more fluorescent light-emitting materials, one or more phosphorescent light-emitting materials or a combination of at least one fluorescent light-emitting material and at least one phosphorescent light-emitting material.

The OLED may contain more that one light-emitting layer, for example a plurality of light-emitting layers that together produce white light.

In other embodiments, the polymer comprising repeat units of formulae (I) and (II) may be provided in a light-emitting layer of an OLED, in which case the hole-transporting layer 103 may or may not be present.

Exemplary OLED layer structures include the following:
Anode/Light-emitting layer/Cathode
Anode/Hole-injection layer/Light-emitting layer/Cathode
Anode/Hole transporting layer/Light-emitting layer/Cathode
Anode/Hole-injection layer/Hole-transporting layer/Light-emitting layer/Cathode
Anode/Hole-injection layer/Hole-transporting layer/Light-emitting layer/Electron-transporting layer/Cathode.

In an embodiment, the polymer comprising repeats unit of formulae (I) and (II) is provided in a hole-transporting layer that is adjacent to a light-emitting layer of the device.

If a hole-transporting layer comprising a polymer comprising repeats unit of formulae (I) and (II) is provided adjacent to a light-emitting layer containing a fluorescent light-emitting material then the lowest singlet excited state ($S_1$) energy level of the polymer is preferably no more than 0.1 eV below that of the fluorescent light-emitting material, preferably at least the same as or higher than that of the fluorescent light-emitting material, in order to avoid quenching of fluorescent light emitted by the fluorescent light-emitting material. For a light-emitting layer containing a blue fluorescent light-emitting material, the singlet energy level of the polymer is preferably at least 2.5 eV.

$S_1$ of a material may be measured by measuring energy of the peak of the fluorescence spectrum of the material.

If a hole-transporting layer comprising a polymer comprising repeats unit of formulae (I) and (II) is provided adjacent to a light-emitting layer containing a phosphorescent light-emitting material then the lowest triplet excited state ($T_1$) energy level of the polymer is preferably no more than 0.1 eV below that of the phosphorescent light-emitting material, preferably at least the same as or higher than that of the phosphorescent light-emitting material, in order to avoid quenching of phosphorescent light emitted by the phosphorescent light-emitting material.

$T_1$ of a material may be measured by measuring energy of the peak of the fluorescence spectrum of the material. The triplet energy level may be measured by low temperature phosphorescence spectroscopy (Y. V. Romaovskii et al, Physical Review Letters, 2000, 85 (5), p 1027, A. van Dijken et al, Journal of the American Chemical Society, 2004, 126, p 7718).

The layer containing the polymer comprising repeats unit of formulae (I) and (II) may consist essentially of that polymer or may contain one or more further components.

The repeat unit of formula (I) contains a fused aromatic or heteroaromatic group $Ar^3$.

It will be appreciated that a fused aromatic or heteroaromatic group $Ar^3$ may provide a greater degree of conjugation than an unfused group, for example phenyl. The fused aromatic or heteroaromatic group $Ar^3$ may provide a shallower HOMO than a material in which phenyl is used in place of $Ar^3$.

Optionally, $Ar^3$ is a group of formula (III):

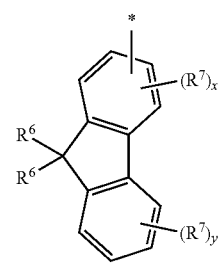

(III)

wherein $R^6$ in each occurrence is independently H or a substituent; $R^7$ in each occurrence is independently a substituent; x is 0, 1, 2 or 3; y is 0, 1, 2, 3 or 4; and * represents a point of attachment to the N atom of the repeat unit of formula (I).

The group of formula (III) may have formula (IIIa):

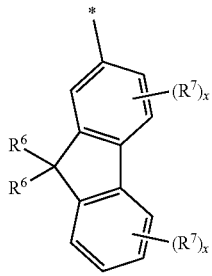

(IIIa)

Optionally, Ar³ is a group of formula (XII):

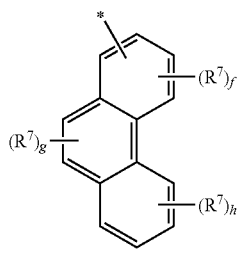

(XII)

wherein R⁷ independently in each occurrence is a substituent; f is 0, 1, 2 or 3; g is 0, 1 or 2; and h is 0, 1, 2, 3 or 4.

Optionally, Ar³ is a group of formula (XIII):

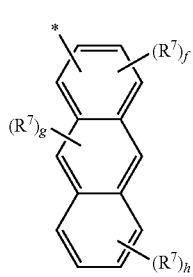

(XIII)

wherein R⁷ independently in each occurrence is a substituent and f, g and h are as described above with reference to formula (XII).

Optionally, Ar³ is a group of formula (XIV):

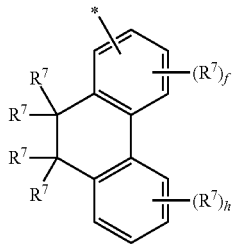

(XIV)

wherein R⁷ independently in each occurrence is a substituent; f and h are as described above with reference to formula (XII); and two groups R⁷ bound to the central ring of formula (XIV) may be linked to form a ring that may be unsubstituted or substituted with one or more substituents.

An exemplary group of formula (XIV) has formula (XIVa):

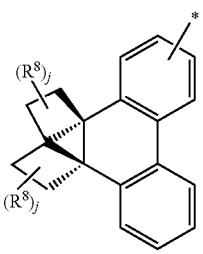

(XIVa)

Wherein R⁸ independently in each occurrence is a substituent, optionally $C_{1-20}$ alkyl, and each j is independently 0, 1, 2 or 3.

In an embodiment, m=0.

In an embodiment, m=1 or 2, with the proviso that Ar² is not phenanthrene if m is 1.

If m=1 or 2 then each R may independently be an unsubstituted or substituted aryl or heteroaryl group, for example a phenyl group that may be unsubstituted or substituted with one or more substituents such as one or more $C_{1-20}$ alkyl groups, or may be Ar³ as described above.

If m=1 or 2 then each Ar² may independently be an unsubstituted or substituted aryl other than phenanthrene or heteroaryl group, and may be unsubstituted phenyl, or phenyl substituted with one or more substituents, for example one or more $C_{1-20}$ alkyl groups.

Optionally each R⁶ is a $C_{1-40}$ hydrocarbyl.

Optionally each R⁷, in the case where at least one of x, y, f, g and h is at least 1, is a $C_{1-40}$ hydrocarbyl.

Exemplary $C_{1-40}$ hydrocarbyl groups R⁶ and R⁷ include $C_{1-20}$ alkyl, and phenyl that may be unsubstituted or substituted with one or more $C_{1-20}$ alkyl groups.

Exemplary repeat units of formula (I) include the following:

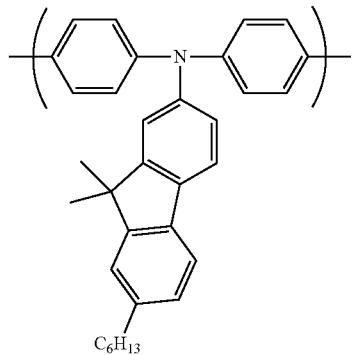

Optionally, the polymer comprises 1-50 mol % of repeat units of formula (I).

Optionally, Ar¹ is phenyl that may be unsubstituted or substituted with one or more substituents The groups Ar¹ of a repeat unit of formula (I) may be the same or different.

The repeat unit of formula (II) contains a substituent $R^{10}$ adjacent to at least one linking position of the repeat unit. The substituent $R^{10}$ creates steric hindrance with the group that the repeat unit of formula (II) is adjacent to, resulting in a twist between the repeat unit of formula (II) and the adjacent group. This twist reduces the conjugation along the polymer backbone as compared to a polymer in which substituents $R^{10}$ are not present.

Optionally, each $R^{10}$ is selected from the group consisting of $C_{1-40}$ hydrocarbyl and a heteroaromatic group that may be unsubstituted or substituted with one or more substituents. Exemplary hydrocarbyl groups include $C_{1-20}$ alkyl; alkylaryl; unsubstituted phenyl; and phenyl substituted with one or more $C_{1-20}$ alkyl groups.

Exemplary groups $R^9$ include:
- alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;
- aryl and heteroaryl groups that may be unsubstituted or substituted with one or more substituents, preferably phenyl substituted with one or more $C_{1-20}$ alkyl groups;
- a linear or branched chain of aryl or heteroaryl groups, each of which groups may independently be substituted, for example a group of formula —$(Ar^3)_r$ wherein each $Ar^3$ is independently an aryl or heteroaryl group and r is at least 2, preferably a branched or linear chain of phenyl groups $Ar^3$, each of which may be unsubstituted or substituted with one or more $C_{1-20}$ alkyl groups; and
- a crosslinkable-group, for example a group comprising a double bond such and a vinyl or acrylate group, or a benzocyclobutane group.

Substituted N, where present, may be —$NR^2$— wherein $R^2$ is $C_{1-20}$ alkyl; unsubstituted phenyl; or phenyl substituted with one or more $C_{1-20}$ alkyl groups.

Optionally, each $R^9$ is a $C_{1-40}$ hydrocarbyl. Exemplary hydrocarbyl groups include $C_{1-20}$ alkyl; unsubstituted phenyl; and phenyl substituted with one or more $C_{1-20}$ alkyl groups.

Optionally, the polymer comprises 1-90 mol % of repeat units of formula (II).

The groups R of a repeat unit of formula (I) may be the same or different. Preferred groups R are $C_{1-40}$ hydrocarbyl, for example $C_{1-20}$ alkyl; unsubstituted phenyl; and phenyl substituted with one or more $C_{1-20}$ alkyl groups.

The polymer may comprise repeat units of formula (I) adjacent to repeat units of formula (II), and the ratios of monomers used to form units of formulae (I) and (II) and/or the polymerisation method used to form the polymer may be selected to produce such adjacent repeat units.

Co-Repeat Units

Polymers of the invention may contain repeat units of formula (I) and (II) and one or more co-repeat units.

Exemplary co-repeat units include arylene repeat units, for example 1,2-, 1,3- and 1,4-phenylene repeat units, 3,6- and 2,7-linked fluorene repeat units, indenofluorene, naphthalene, anthracene and phenanthrene repeat units, each of which may be unsubstituted or substituted with one or more substituents, for example one or more $C_{1-40}$ hydrocarbyl substituents.

The polymer may comprise one or more crosslinkable repeat units. Crosslinkable groups of a crosslinkable repeat unit may be provided as a substituent of a repeat unit of formula (I) or (II), or as a substituent of a co-repeat unit.

The polymer is preferably at least partially conjugated, and repeat units of formula (I) and (II) are preferably directly linked to aromatic or heteroaromatic groups of adjacent co-repeat units.

One preferred class of arylene repeat units is phenylene repeat units, such as phenylene repeat units of formula (III):

wherein p in each occurrence is independently 0, 1, 2, 3 or 4, optionally 1 or 2; n is 1, 2 or 3; and $R^1$ independently in each occurrence is a substituent.

Where present, each $R^1$ may independently be selected from the group consisting of:
- alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;
- aryl and heteroaryl groups that may be unsubstituted or substituted with one or more substituents, preferably phenyl substituted with one or more $C_{1-20}$ alkyl groups;
- a linear or branched chain of aryl or heteroaryl groups, each of which groups may independently be substituted, for example a group of formula —$(Ar^3)_r$ wherein each $Ar^3$ is independently an aryl or heteroaryl group and r is at least 2, preferably a branched or linear chain of phenyl groups each of which may be unsubstituted or substituted with one or more $C_{1-20}$ alkyl groups; and
- a crosslinkable-group, for example a group comprising a double bond such and a vinyl or acrylate group, or a benzocyclobutane group.

Substituted N, where present, may be —$NR^2$— wherein $R^2$ is $C_{1-20}$ alkyl; unsubstituted phenyl; or phenyl substituted with one or more $C_{1-20}$ alkyl groups.

Preferably, each $R^1$ is independently selected from $C_{1-40}$ hydrocarbyl, and is more preferably selected from $C_{1-20}$ alkyl; unsubstituted phenyl; and phenyl substituted with one or more $C_{1-20}$ alkyl groups.

If n is 1 then exemplary repeat units of formula (III) include the following:

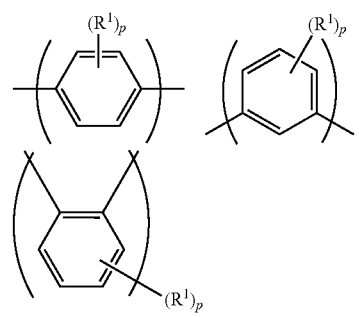

If the repeat unit of formula (III) is 1,4-linked and if p is 0 then the extent of conjugation of repeat unit of formula (III) to one or both adjacent repeat units may be relatively high.

If p is at least 1, and/or the repeat unit is 1,2- or 1,3 linked, then the extent of conjugation of repeat unit of formula (III) to one or both adjacent repeat units may be relatively low. In one preferred arrangement, the repeat unit of formula (III) is 1,3-linked and p is 0, 1, 2 or 3. In another preferred arrangement, the repeat unit of formula (III) has formula (IIIa):

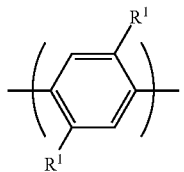

Substituents $R^1$ of formula (IIIa) are adjacent to linking positions of the repeat unit, which may cause steric hindrance between the repeat unit of formula (IIIa) and adjacent repeat units, resulting in the repeat unit of formula (IIIa) twisting out of plane relative to one or both adjacent repeat units.

Exemplary repeat units where n is 2 or 3 include the following:

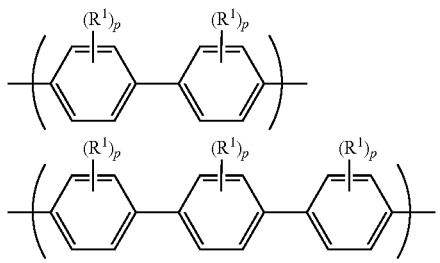

A preferred repeat unit has formula (IIIb):

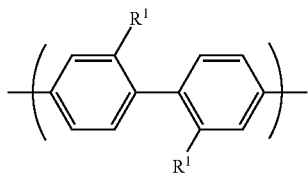

The two $R^1$ groups of formula (IIIb) may cause steric hindrance between the phenyl rings they are bound to, resulting in twisting of the two phenyl rings relative to one another.

A further class of arylene repeat units are optionally substituted fluorene repeat units, such as repeat units of formula (IV):

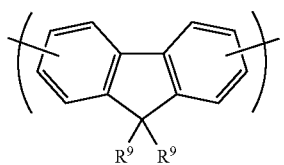

wherein $R^9$ independently in each occurrence is as described with reference to formula (II), and wherein the two groups $R^9$ may be linked to form a ring. Repeat units of formula (IV) differ from repeat units of formula (II) in that aromatic carbon atoms of the repeat unit of formula (IV) are unsubstituted.

The repeat unit of formula (IV) may be an optionally substituted 2,7-linked repeat unit.

The extent of conjugation of repeat units of formulae (IV) may be limited by linking the repeat unit through the 3- and/or 6-positions to limit the extent of conjugation across the repeat unit.

Exemplary repeat units of formula (IV) include repeat units disclosed in WO 2012/104579, the contents of which are incorporated herein by reference.

Another exemplary arylene repeat unit has formula (V):

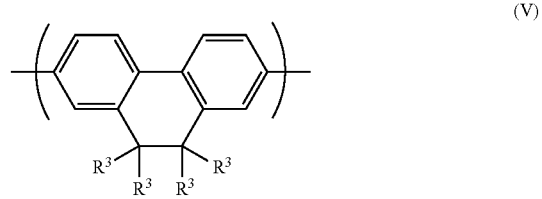

wherein each $R^3$ is H or a substituent, and any two groups $R^3$ may be linked to form an unsubstituted or substituted ring, for example a ring substituted with one or more $C_{1-20}$ alkyl groups.

Each $R^3$ may independently be selected from the group consisting of:
  alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;
  aryl and heteroaryl groups that may be unsubstituted or substituted with one or more substituents, preferably phenyl substituted with one or more $C_{1-20}$ alkyl groups;
  a linear or branched chain of aryl or heteroaryl groups, each of which groups may independently be substituted, for example a group of formula —$(Ar^3)_r$ wherein each $Ar^3$ is independently an aryl or heteroaryl group and r is at least 2, preferably a branched or linear chain of phenyl groups $Ar^3$, each of which may be unsubstituted or substituted with one or more $C_{1-20}$ alkyl groups; and
  a crosslinkable-group, for example a group comprising a double bond such as a vinyl or acrylate group, or a benzocyclobutane group.

In the case where $R^3$ comprises an aryl or heteroaryl group, or a linear or branched chain of aryl or heteroaryl groups, the or each aryl or heteroaryl group may be substituted with one or more substituents $R^4$ selected from the group consisting of:
  alkyl, for example $C_{1-20}$ alkyl, wherein one or more non-adjacent C atoms may be replaced with O, S, substituted N, C=O and —COO— and one or more H atoms of the alkyl group may be replaced with F;
  $NR^5_2$, $OR^5$, $SR^5$, and
  fluorine, nitro and cyano;
wherein each $R^5$ is independently selected from the group consisting of alkyl, preferably $C_{1-20}$ alkyl; and aryl or heteroaryl, preferably phenyl, optionally substituted with one or more $C_{1-20}$ alkyl groups.

Substituted N, where present, may be —$NR^2$— wherein $R^2$ is $C_{1-20}$ alkyl; unsubstituted phenyl; or phenyl substituted with one or more $C_{1-20}$ alkyl groups.

Preferably, each $R^3$ is independently selected from $C_{1-40}$ hydrocarbyl, and is more preferably selected from $C_{1-20}$ alkyl; unsubstituted phenyl; phenyl substituted with one or more $C_{1-20}$ alkyl groups; a linear or branched chain of phenyl groups, wherein each phenyl may be unsubstituted or substituted with one or more substituents; and a crosslinkable group.

Aromatic carbon atoms of the repeat unit of formula (V) may be unsubstituted, or may be substituted with one or more substituents. Exemplary substituents are alkyl, for example $C_{1-20}$ alkyl, wherein one or more non-adjacent C atoms may be replaced with O, S, NH or substituted N, C=O and —COO—, optionally substituted aryl, optionally substituted heteroaryl, alkoxy, alkylthio, fluorine, cyano and arylalkyl. Particularly preferred substituents include $C_{1-20}$ alkyl and substituted or unsubstituted aryl, for example phenyl. Optional substituents for the aryl include one or more $C_{1-20}$ alkyl groups.

Further arylene co-repeat units include: phenanthrene repeat units; naphthalene repeat units; anthracene repeat units; and perylene repeat units. Each of these arylene repeat units may be linked to adjacent repeat units through any two of the aromatic carbon atoms of these units. Specific exemplary linkages include 9,10-anthracene; 2,6-anthracene; 1,4-naphthalene; 2,6-naphthalene; 2,7-phenanthrene; and 2,5-perylene. Each of these repeat units may be substituted or unsubstituted, for example substituted with one or more $C_{1-40}$ hydrocarbyl groups.

Co-repeat units may contain only aromatic or heteroaromatic groups in the repeat unit backbone, for example as described above with respect to formulae (III), (IV) and (V), or may contain non-aromatic or heteroaromatic groups in the repeat unit backbone, for example a repeat unit of formula (XII):

$$(-Ar^{11}-Sp^1-Ar^{11})- \quad\quad (XII)$$

wherein $Ar^{11}$ in each occurrence independently represents a substituted or unsubstituted aryl or heteroaryl group; and $Sp^1$ represents a spacer group that does not provide any conjugation path between the two groups $Ar^{11}$.

$Sp^1$ may contain a single non-conjugating atom only between the two groups $Ar^{11}$, or $Sp^1$ may contain non-conjugating chain of at least 2 atoms separating the two groups $Ar^{11}$.

A non-conjugating atom may be, for example, —O—, —S—, —$CR^{11}_2$— or —$SiR^{11}_2$— or wherein $R^{11}$ in each occurrence is H or a substituent, optionally $C_{1-20}$ alkyl.

A spacer chain $Sp^1$ may contain two or more atoms separating the two groups $Ar^{11}$, for example a $C_{1-20}$ alkyl chain wherein one or more non-adjacent C atoms of the chain may be replaced with O or S. Preferably, the spacer chain $Sp^1$ contains at least one $sp^3$-hybridised carbon atom separating the two groups $Ar^{11}$.

Preferred groups $Sp^1$ are selected from $C_{1-20}$ alkyl wherein one or more non-adjacent C atoms may be replaced with O.

Non conjugating repeat units may make up to 20 mol % of the repeat units of the polymer, optionally up to 10 mol % or up to 5 mol %.

Polymer Synthesis

Polymers comprising repeat units of formula (I) and (II) may be prepared by "metal insertion" polymerisation wherein the metal atom of a metal complex catalyst is inserted between an aryl or heteroaryl group and a leaving group of a monomer. Exemplary metal insertion methods are Suzuki polymerisation as described in, for example, WO 00/53656 and Yamamoto polymerisation as described in, for example, T. Yamamoto, "Electrically Conducting And Thermally Stable pi-Conjugated Poly(arylene)s Prepared by Organometallic Processes", Progress in Polymer Science 1993, 17, 1153-1205. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units illustrated throughout this application may be derived from a monomer carrying suitable leaving groups. Likewise, an end-capping group or side group carrying only one reactive leaving group may be bound to the polymer by reaction of a leaving group at the polymer chain end or side respectively, and monomers containing more than two reactive groups may be used to form branching points in the polymer.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular copolymers may be prepared when both reactive groups of a first monomer are boron and both reactive groups of a second monomer are halogen.

The polymerization method may be selected to control the locations of repeat units relative to one another. The number of moles of repeat units of formula (I) and (II) may be selected according to the desired amount of adjacent units of formula (I) and (II).

For example, if at least 50 mol % of the monomers of a polymerization mixture consist of boronic acid monomers for forming repeat units of formula (II), and if repeat units of formula (I) are formed from halogenated monomers then all repeat units of formula (I) in the resultant polymer will be adjacent to a repeat unit of formula (II).

As alternatives to halides, other leaving groups capable of participating in metal insertion include sulfonic acids and sulfonic acid esters such as tosylate, mesylate and triflate.

Light-Emitting Layers

An OLED may contain one or more light-emitting layers. A light-emitting layer may contain a polymer comprising repeat units of formula (I) and (II).

Suitable light-emitting materials for a light-emitting layer include polymeric, small molecule and dendrimeric light-emitting materials, each of which may be fluorescent or phosphorescent.

A light-emitting layer of an OLED may be unpatterned, or may be patterned to form discrete pixels. Each pixel may be further divided into subpixels. The light-emitting layer may contain a single light-emitting material, for example for a monochrome display or other monochrome device, or may contain materials emitting different colours, in particular red, green and blue light-emitting materials for a full-colour display.

A light-emitting layer may contain a mixture of more than one light-emitting material, for example a mixture of light-emitting materials that together provide white light emission.

A blue light emitting material may have a photoluminescent spectrum with a peak in the range of 400-490 nm.

A green light emitting material may have a photoluminescent spectrum with a peak in the range of more than 490 nm up to 580 nm.

A red light emitting material may optionally have a peak in its photoluminescent spectrum of more than 580 nm up to 650 nm, preferably 600-630 nm.

Exemplary fluorescent polymeric light-emitting materials include polymers comprising one or more of arylene repeat units, arylene vinylene repeat units and arylamine repeat units. A fluorescent light-emitting layer may consist of a light-emitting material alone or may further comprise one or more further materials mixed with the light-emitting material. Exemplary further materials may be selected from hole-transporting materials; electron-transporting materials and triplet-accepting materials, for example a triplet-accepting polymer as described in WO 2013/114118, the contents of which are incorporated herein by reference.

Exemplary arylene repeat units are as described above, for example units of formulae (III), (IV) and (V). Exemplary arylamine repeat units have formula (VI):

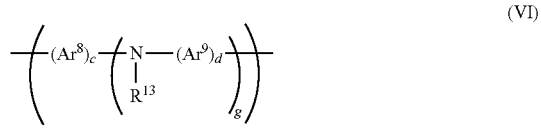

(VI)

wherein $Ar^8$ and $Ar^9$ in each occurrence are independently selected from substituted or unsubstituted aryl or heteroaryl, g is greater than or equal to 1, preferably 1 or 2, $R^{13}$ is H or a substituent, preferably a substituent, and c and d are each independently 1, 2 or 3.

$R^{13}$, which may be the same or different in each occurrence when g>1, is preferably selected from the group consisting of alkyl, for example $C_{1-20}$ alkyl, $Ar^{10}$, a branched or linear chain of $Ar^{10}$ groups, or a crosslinkable unit that is bound directly to the N atom of formula (VI) or spaced apart therefrom by a spacer group, wherein $Ar^{10}$ in each occurrence is independently optionally substituted aryl or heteroaryl. Exemplary spacer groups are $C_{1-20}$ alkyl, phenyl and phenyl-$C_{1-20}$ alkyl.

Any of $Ar^8$, $Ar^9$ and, if present, $Ar^{10}$ in the repeat unit of Formula (VI) may be linked by a direct bond or a divalent linking atom or group to another of $Ar^8$, $Ar^9$ and $Ar^{10}$.

Preferred divalent linking atoms and groups include O, S; substituted N; and substituted C.

Any of $Ar^8$, $Ar^9$ and, if present, $Ar^{10}$ may be substituted with one or more substituents. Exemplary substituents are substituents $R^5$, wherein each $R^5$ may independently be selected from the group consisting of:

substituted or unsubstituted alkyl, optionally $C_{1-20}$ alkyl, wherein one or more non-adjacent C atoms may be replaced with optionally substituted aryl or heteroaryl, O, S, substituted N, C=O or —COO— and one or more H atoms may be replaced with F; and a crosslinkable group attached directly to the fluorene unit or spaced apart therefrom by a spacer group, for example a group comprising a double bond such and a vinyl or acrylate group, or a benzocyclobutane group.

Preferred repeat units of formula (VI) have formulae 1-3:

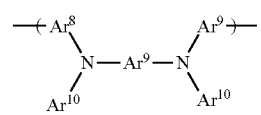

1

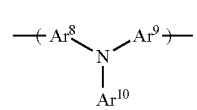

2

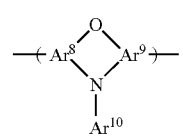

3

In one preferred arrangement, $R^{13}$ is $Ar^{10}$ and each of $Ar^8$, $Ar^9$ and $Ar^{10}$ are independently and optionally substituted with one or more $C_{1-20}$ alkyl groups. $Ar^8$, $Ar^9$ and $Ar^{10}$ are preferably phenyl.

In another preferred arrangement, $Ar^8$ and $Ar^9$ are phenyl, each of which may be substituted with one or more $C_{1-20}$ alkyl groups, and $R^{13}$ is —$(Ar^{10})_r$ wherein r is at least 2 and wherein the group —$(Ar^{10})_r$ forms a linear or branched chain of aromatic or heteroaromatic groups, for example 3,5-diphenylbenzene wherein each phenyl may be substituted with one or more $C_{1-20}$ alkyl groups, for example as disclosed in WO 2010/001982, the contents of which are incorporated herein by reference.

In another preferred arrangement, c, d and g are each 1 and $Ar^8$ and $Ar^9$ are phenyl linked by an oxygen atom to form a phenoxazine ring.

Amine repeat units may be provided in a molar amount in the range of about 0.5 mol % up to about 50 mol %, optionally about 1-25 mol %, optionally about 1-10 mol %.

Amine repeat units may provide hole-transporting and/or light-emitting functionality.

Preferred light-emitting polymers are copolymers comprising one or more arylene repeat units selected from formulae (III), (IV) and (V) and one or more amine repeat units of formula (VI).

Exemplary phosphorescent light-emitting materials include metal complexes comprising substituted or unsubstituted complexes of formula (IX):

$$ML^1_qL^2_rL^3_s \qquad (IX)$$

wherein M is a metal; each of $L^1$, $L^2$ and $L^3$ is a coordinating group; q is an integer; r and s are each independently 0 or an integer; and the sum of (a·q)+(b·r)+(c·s) is equal to the number of coordination sites available on M, wherein a is the number of coordination sites on $L^1$, b is the number of coordination sites on $L^2$ and c is the number of coordination sites on $L^3$. Preferably, a, b and c are each 1 or 2. Preferably, a, b and c are each 2 (bidentate ligands). Preferably, q is 2 or 3 and r and s are 0 or 1.

Heavy elements M induce strong spin-orbit coupling to allow rapid intersystem crossing and emission from triplet or higher states. Suitable heavy metals M include d-block metals, in particular those in rows 2 and 3 i.e. elements 39 to 48 and 72 to 80, in particular ruthenium, rhodium, palladium, rhenium, osmium, iridium, platinum and gold. Iridium is particularly preferred.

Exemplary ligands $L^1$, $L^2$ and $L^3$ include carbon or nitrogen donors such as porphyrin or bidentate ligands of formula (X):

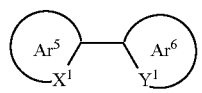

wherein $Ar^5$ and $Ar^6$ may be the same or different and are independently selected from substituted or unsubstituted aryl or heteroaryl; $X^1$ and $Y^1$ may be the same or different and are independently selected from carbon or nitrogen; and $Ar^5$ and $Ar^6$ may be fused together. Ligands wherein $X^1$ is carbon and $Y^1$ is nitrogen are preferred, in particular ligands in which $Ar^5$ is a single ring or fused heteroaromatic of N and C atoms only, for example pyridyl or isoquinoline, and $Ar^6$ is a single ring or fused aromatic, for example phenyl or naphthyl.

Examples of bidentate ligands are illustrated below:

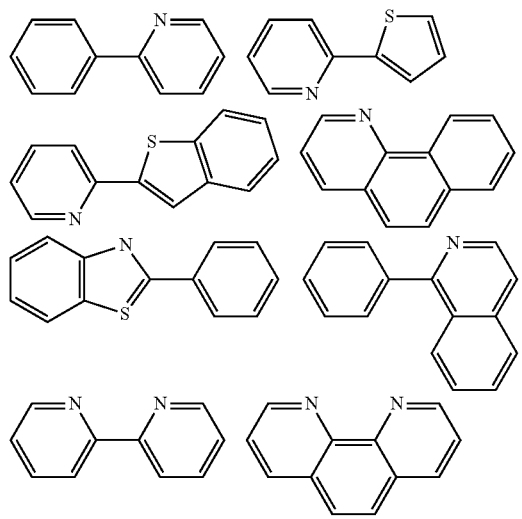

Each of $Ar^5$ and $Ar^6$ may carry one or more substituents. Two or more of these substituents may be linked to form a ring, for example an aromatic ring.

Other ligands suitable for use with d-block elements include diketonates, in particular acetylacetonate (acac); triarylphosphines and pyridine, each of which may be substituted.

Exemplary substituents include groups $R^{13}$ as described above with reference to Formula (VI). Particularly preferred substituents include fluorine or trifluoromethyl which may be used to blue-shift the emission of the complex, for example as disclosed in WO 02/45466, WO 02/44189, US 2002-117662 and US 2002-182441; alkyl or alkoxy groups, for example $C_{1-20}$ alkyl or alkoxy, which may be as disclosed in JP 2002-324679; carbazole which may be used to assist hole transport to the complex when used as an emissive material, for example as disclosed in WO 02/81448; bromine, chlorine or iodine which can serve to functionalise the ligand for attachment of further groups, for example as disclosed in WO 02/68435 and EP 1245659; and dendrons which may be used to obtain or enhance solution processability of the metal complex, for example as disclosed in WO 02/66552.

A light-emitting dendrimer typically comprises a light-emitting core bound to one or more dendrons, wherein each dendron comprises a branching point and two or more dendritic branches. Preferably, the dendron is at least partially conjugated, and at least one of the branching points and dendritic branches comprises an aryl or heteroaryl group, for example a phenyl group. In one arrangement, the branching point group and the branching groups are all phenyl, and each phenyl may independently be substituted with one or more substituents, for example alkyl or alkoxy.

A dendron may have optionally substituted formula (XI)

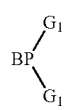

(XI)

wherein BP represents a branching point for attachment to a core and $G_1$ represents first generation branching groups.

The dendron may be a first, second, third or higher generation dendron. $G_1$ may be substituted with two or more second generation branching groups $G_2$, and so on, as in optionally substituted formula (XIa):

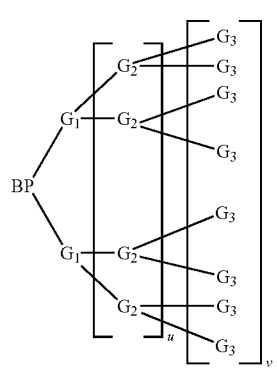

(XIa)

wherein u is 0 or 1; v is 0 if u is 0 or may be 0 or 1 if u is 1; BP represents a branching point for attachment to a core and $G_1$, $G_2$ and $G_3$ represent first, second and third generation dendron branching groups. In one preferred embodiment, each of BP and $G_1$, $G_2$ . . . $G_n$ is phenyl, and each phenyl BP, $G_1$, $G_2$ . . . $G_{n-1}$ is a 3,5-linked phenyl.

A preferred dendron is a substituted or unsubstituted dendron of formula (XIb):

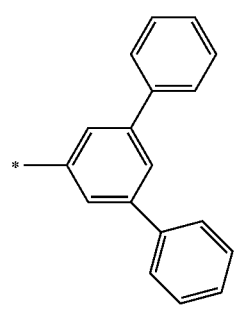

(XIb)

wherein * represents an attachment point of the dendron to a core.

BP and/or any group G may be substituted with one or more substituents, for example one or more $C_{1-20}$ alkyl or alkoxy groups.

Phosphorescent light-emitting materials may be provided in a light-emitting layer with a host material. The host preferably has a triplet energy level that is no more than 0.1 eV lower than that of the phosphorescent light-emitting material, more preferably a triplet energy level that the same as or higher than that of the phosphorescent light-emitting material.

Suitable host materials include small molecule, dendrimeric and polymeric host materials. Polymeric host materials include non-conjugated polymers with pendant charge-transporting groups, for example polyvinylcarbazole, and at least partially conjugated polymers, for example polymers comprising one or both of arylene repeat units and amine repeat units, for example arylene repeat units of formula (III), (IV) and (V) and amine repeat units of formula (VI).

Phosphorescent light-emitting materials may make up about 0.05 mol % up to about 20 mol %, optionally about 0.1-10 mol % of a host/phosphorescent light-emitting material composition.

The phosphorescent light-emitting material may be physically mixed with the host material or may be covalently bound thereto. In the case of a polymeric host, the phosphorescent light-emitting material may be provided in a side-chain, main chain or end-group of the polymer. Where the phosphorescent material is provided in a polymer side-chain, the phosphorescent material may be directly bound to the backbone of the polymer or spaced apart therefrom by a spacer group, for example a $C_{1-20}$ alkyl spacer group in which one or more non-adjacent C atoms may be replaced by O or S.

Hole Injection Layers

A conductive hole injection layer, which may be formed from a conductive organic or inorganic material, may be provided between the anode and the light-emitting layer or layers of an OLED to improve hole injection from the anode into the layer or layers of semiconducting polymer. Examples of doped organic hole injection materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and optionally substituted polythiophene or poly(thienothiophene). Examples of conductive inorganic materials include transition metal oxides such as VOx MoOx and RuOx as disclosed in Journal of Physics D: Applied Physics (1996), 29(11), 2750-2753.

Where a hole-transporting layer is present, a hole-injection layer may be provided between the anode and the hole-transporting layer.

Charge Transporting and Charge Blocking Layers

A hole transporting layer may be provided between the anode and the light-emitting layer or layers, as described above. Likewise, an electron transporting layer may be provided between the cathode and the light-emitting layer or layers.

Similarly, an electron blocking layer may be provided between the anode and the light-emitting layer and a hole blocking layer may be provided between the cathode and the light-emitting layer. Transporting and blocking layers may be used in combination. Depending on its HOMO and LUMO levels, a single layer may both transport one of holes and electrons and block the other of holes and electrons.

If present, a hole transporting layer located between the anode and the light-emitting layers preferably has a HOMO level of less than or equal to 5.5 eV, more preferably around 4.8-5.5 eV as measured by cyclic voltammetry. The HOMO level of the hole transport layer may be selected so as to be within 0.2 eV, optionally within 0.1 eV, of an adjacent layer (such as a light-emitting layer) in order to provide a small barrier to hole transport between these layers. The hole-transporting layer may be a polymer comprising repeat units of formula (I) as described above.

If present, an electron transporting layer located between the light-emitting layers and cathode preferably has a LUMO level of around 2.5-3.5 eV as measured by cyclic voltammetry. For example, a layer of a silicon monoxide or silicon dioxide or other thin dielectric layer having thickness in the range of 0.2-2 nm may be provided between the light-emitting layer nearest the cathode and the cathode. HOMO and LUMO levels may be measured using cyclic voltammetry.

An electron transporting layer may contain a polymer comprising a chain of optionally substituted arylene repeat units, such as a chain of fluorene repeat units.

Cathode

The cathode is selected from materials that have a workfunction allowing injection of electrons into the light-emitting layer. Other factors influence the selection of the cathode such as the possibility of adverse interactions between the cathode and the light-emitting material. The cathode may consist of a single material such as a layer of aluminium. Alternatively, it may comprise a plurality of conductive materials, for example a plurality of conductive metals such a bilayer of a low workfunction material and a high workfunction material such as calcium and aluminium as disclosed in WO 98/10621. The cathode may comprise a layer of elemental barium, for example as disclosed in WO 98/57381, Appl. Phys. Lett. 2002, 81(4), 634 and WO 02/84759. The cathode may comprise a thin (e.g. less than 5 nm) layer of metal compound between the organic semiconducting layers and one or more conductive cathode layers, in particular an oxide or fluoride of an alkali or alkali earth metal, to assist electron injection, for example lithium fluoride, for example as disclosed in WO 00/48258; barium fluoride, for example as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Formulation Processing

Polymers comprising repeat units of formula (I) may be dispersed or dissolved in a solvent or mixture of two or more solvents to form a formulation that may be used to form a layer containing the compound by depositing the formulation and evaporating the solvent or solvents. The formulation may contain one or more further materials in addition to the polymer. All of the components of the formulation may be dissolved in the solvent or solvent mixture, in which case the formulation is a solution, or one or more components may be dispersed in the solvent or solvent mixture. Preferably, the formulation is a solution. Exemplary solvents for polymers comprising repeat units of formula (I) are mono- and poly-alkylated benzene, for example toluene and xylenes.

Techniques for forming layers from a formulation include printing and coating techniques such spin-coating, dip-coating, roll printing, screen printing and inkjet printing.

Multiple organic layers of an OLED may be formed by deposition of formulations containing the active materials for each layer.

During OLED formation, a layer of the device may be crosslinked to prevent it from partially or completely dissolving in the solvent or solvents used to deposit an overlying layer. Where used as a hole-transporting layer, polymers comprising repeat units of formulae (I) and (II) may be crosslinked following deposition prior to deposition of an overlying layer.

Suitable crosslinkable groups include groups comprising a reactive double bond such and a vinyl or acrylate group, or a benzocyclobutane group. Crosslinkable groups may be provided as substituents of a repeat unit of the polymer, and may be attached directly to a backbone of the polymer or spaced apart therefrom by a spacer chain, for example a $C_{1-20}$ hydrocarbyl group.

Coating methods such as spin-coating are particularly suitable for devices wherein patterning of the light-emitting layer is unnecessary—for example for lighting applications or simple monochrome segmented displays.

Printing methods such as inkjet printing are particularly suitable for high information content displays, in particular full colour displays. A device may be inkjet printed by providing a patterned layer over the first electrode and defining wells for printing of one colour (in the case of a monochrome device) or multiple colours (in the case of a multicolour, in particular full colour device). Each well may define a pixel area, and each pixel may be subdivided into subpixels. The patterned layer may be a layer of photoresist that is patterned to define wells as described in, for example, EP 0880303.

As an alternative to wells, the formulation may be printed into channels defined within a patterned layer. In particular, the photoresist may be patterned to form channels which, unlike wells, extend over a plurality of pixels and which may be closed or open at the channel ends.

Examples

Monomer Synthesis

Monomer 1 was prepared as described in WO 2013/191086, the contents of which are incorporated herein by reference.

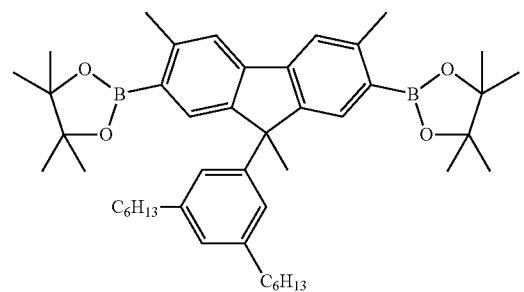

Monomer 2 was prepared according to the following reaction scheme:

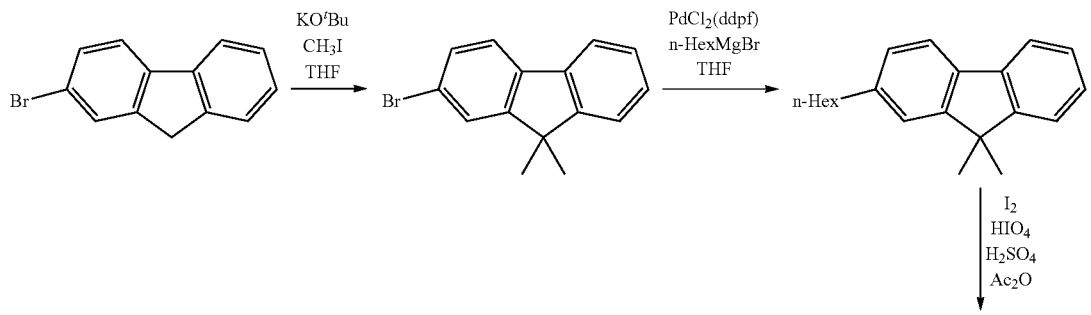

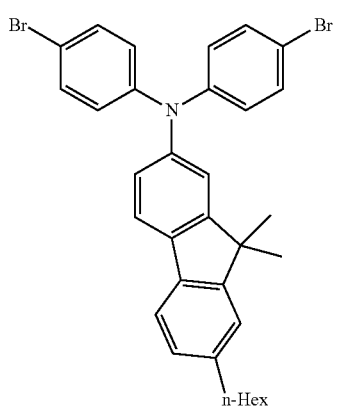

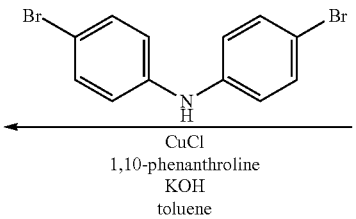

-continued

Stage 1:

To a solution of 2-bromo-9-H,H-fluorene (105 g, 428 mmol) in anhydrous THF (1 L) in a 2 L 3-necked flask under an atmosphere of dry dinitrogen gas was added potassium tert-butoxide (115.3 g, 1028 mmol) and the mixture stirred for 30 minutes. The mixture was cooled to 0° C. using an ice bath and methyl iodide (146.03 g, 1028 mmol) was added slowly, maintaining the internal temperature at 0° C. Once the addition was finished the reaction mixture was allowed to warm to room temperature and stirred for a further 16 hours. After this time water (500 mL) was added to the reaction mixture and the organic fraction extracted with ethyl acetate (2×300 mL). The combined organic phases were washed with water (500 mL) and brine (500 mL), dried over $Na_2SO_4$ and the volatiles removed to yield stage 1 (115 g, 90% yield).

$^1$H-NMR (400 MHz, $CDCl_3$): δ [ppm] 1.49 (s, 6H), 7.34-7.38 (m, 2H), 7.43-7.49 (m, 2H), 7.56-7.61 (m, 2H), 7.69-7.72 (m, 1H).

Stage 2:

Magnesium (63.48 g, 2610 mmol) was placed in a 3 L 3-necked flask under an atmosphere of dry dinitrogen gas and anhydrous THF (1.2 L) was added. To the flask was added 1,2-dibromoethane (5 mL), the mixture warmed to 60° C. and 1-bromohexane (347.7 g, 2191 mmol) was added slowly. Once addition was finished the resulting black mixture was heated to reflux for a further 2 hours.

In a second flask under dry dinitrogen gas a solution of 2-bromo-9,9-dimethyl-fluorene (115 g, 421 mmol), $PdCl_2$ (dppf) (17.19 g, 21 mmol) in anhydrous THF (800 mL) was prepared. The solution of the fluorene was warmed to 80° C. and the solution of Grignard reagent added slowly. Once addition was finished the reaction mixture was heated at 80° C. for 16 hours. After this time the reaction mixture was allowed to cool and quenched with ice-cooled HCl solution (1.5N, 5 L) and the organic fractions extracted with ethyl acetate (2×2.5 L). The organic fractions were combined, dried over $Na_2SO_4$ and the volatiles removed under reduced pressure to afford the crude product. The crude product was purified by vacuum distillation (95° C. at 0.1 Torr) to obtain stage 2 as a yellow oil (100 g, 85%).

$^1$H-NMR (300 MHz, $CDCl_3$): δ [ppm] 0.91 (t, J=6.93 Hz, 3H), 1.32-1.42 (m, 6H), 1.49 (s, 6H), 1.62-1.70 (m, 2H), 2.69 (t, J=7.98 Hz, 2H), 7.16 (m, 1H), 7.22-7.26 (m, 1H), 7.28-7.35 (m, 2H), 7.41-7.44 (m, 1H), 7.63 (d, J=7.71 Hz, 1H), 7.68-7.71 (m, 1H)

Stage 3:

To a 3 L 3-necked flask under an atmosphere of dry dinitrogen gas was added stage 2 (100 g, 359 mmol), $H_2SO_4$ (2M, 300 mL), acetic anhydride (1.7 L), iodine (39.2 g, 154 mmol) and periodic acid (18 g, 79 mmol). The mixture was refluxed at 90° C. for 4.5 hours and allowed to cool to room temperature. Once cool the reaction was quenched with ice and the organics extracted with ethyl acetate (2×600 mL). The combined organic fractions were washed with water (500 mL) and brine (300 mL) and dried over $Na_2SO_4$. The volatiles were removed under reduced pressure to afford the crude product. The crude product was purified by column chromatography (silica gel, 230-400 mesh), eluting with pentane. The purer fractions were collected and the column chromatography repeated under the same conditions to afford Stage 3. The fractions were analysed by HPLC and those fractions above 85% purity were used for the subsequent steps.

$^1$H-NMR (400 MHz, $CDCl_3$): δ [ppm] 0.91 (t, J=6.96 Hz, 3H), 1.33-1.40 (m, 6H), 1.47 (s, 6H), 1.63-1.70 (m, 2H), 2.68 (t, J=7.88 Hz, 2H), 7.17 (d, J=7.76 Hz, 1H), 7.23 (s, 1H), 7.44 (d, J=7.96 Hz, 1H), 7.60 (d, J=7.72 Hz, 1H), 7.64 (dd, J=1.44, 7.94 Hz, 1H), 7.74 (d, J=1.36 Hz, 1H).

Stage 4:

A mixture of stage 3 (30 g, 74 mmol), bis(4-bromophenyl) amine (30.35 g, 92 mmol), KOH (24.93 g, 445 mmol), CuCl (1.45 g, 14 mmol) and 1,10-phenanthroline (2.67 g, 14 mmol) in toluene (600 mL) was placed in a 1 L 3-necked flask under an atmosphere of dry dinitrogen gas. The mixture was sparged with dinitrogen gas for 10 minutes, and heated to reflux (110° C.) for 4 days. The reaction mixture was allowed to cool to room temperature and filtered through a plug of celite. The volatiles were removed and the residue dissolved in ethyl acetate (1 L) and washed with water (2×300 mL) and brine (300 mL), dried over $Na_2SO_4$ and the volatiles removed under reduced pressure to afford the crude product. The crude product was purified using column chromatography (silica gel, 60-120 mesh), eluting with 2% ethyl acetate in petroleum ether. Those fractions with purity >99.3% by HPLC were combined and repeatedly washed with pentane to afford Monomer 1 as a white solid (10.8 g, 24% yield).

$^1$H-NMR (400 MHz, $CDCl_3$): δ [ppm] 0.90 (t, J=6.96 Hz, 3H), 1.32-1.38 (m, 6H), 1.41 (s, 6H), 1.62-1.68 (m, 2H), 2.68 (t, J=7.56 Hz, 2H), 6.98 (d, J=8.72 Hz, 4H), 6.99 (s, 1H), 7.13-7.15 (m, 2H), 7.21 (s, 1H), 7.36 (d, J=8.84 Hz, 4H), 7.56 (d, J=8.12 Hz, 2H).

Polymer Example 1

A polymer was prepared by Suzuki polymerisation as described in WO 00/53656 of the following monomers:

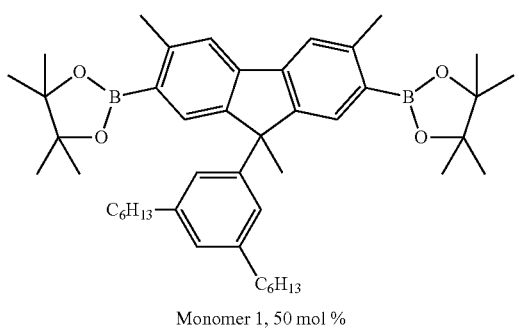

Monomer 1, 50 mol %

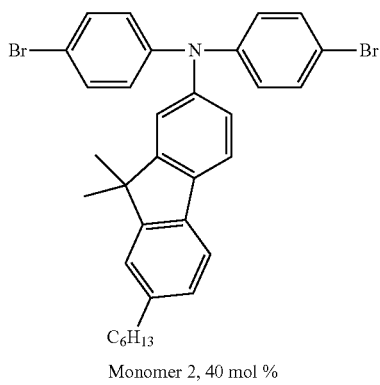

Monomer 2, 40 mol %

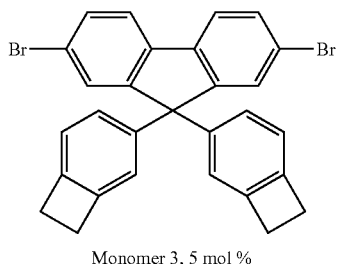

Monomer 3, 5 mol %

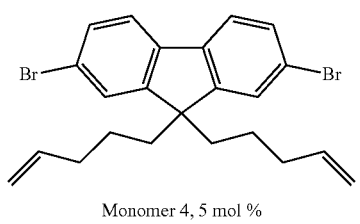

Monomer 4, 5 mol %

Comparative Polymer 1

A polymer was prepared as described in Polymer Example 1, except that Monomer 1 was replaced with Monomer 5:

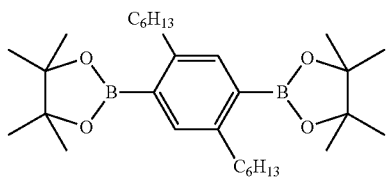

Monomer 5

Device Example 1

A blue fluorescent organic light-emitting device having the following structure was prepared An organic light-emitting device having the following structure was prepared:
ITO/HIL/HTL/LE/Cathode Wherein ITO is an indium-tin oxide anode; HIL is a hole-injecting layer comprising a hole-injecting material, HTL is a hole-transporting layer formed by spin-coating Polymer Example 1, LE is a light-emitting layer formed by spin-coating a 9:1 w/w mixture of a blue light-emitting polymer comprising fluorene repeat units of formula (IV), amine repeat units of formula (VI) and repeat units of formula (V), and an additive polymer The cathode comprises a layer of metal fluoride in contact with the light-emitting layer and a layer of aluminium formed over the layer of metal fluoride.

A substrate carrying ITO was cleaned using UV/Ozone. The hole injection layer was formed by spin-coating an aqueous formulation of a hole-injection material. A hole transporting layer was formed to a thickness of 22 nm by spin-coating Polymer Example 1 and crosslinking the polymer by heating. A light-emitting layer was formed by depositing a light-emitting composition of a blue light-emitting polymer and an additive polymer to a thickness of 65 nm. A cathode was formed by evaporation of a first layer of a metal fluoride to a thickness of about 2 nm, a second layer of aluminium to a thickness of about 200 nm and an optional third layer of silver.

Comparative Device 1

A blue fluorescent organic light-emitting device was prepared as described for Device Example 1 except that the hole-transporting layer was formed by spin-coating Comparative Polymer 1 in place of Polymer Example 1.

Figure 2:
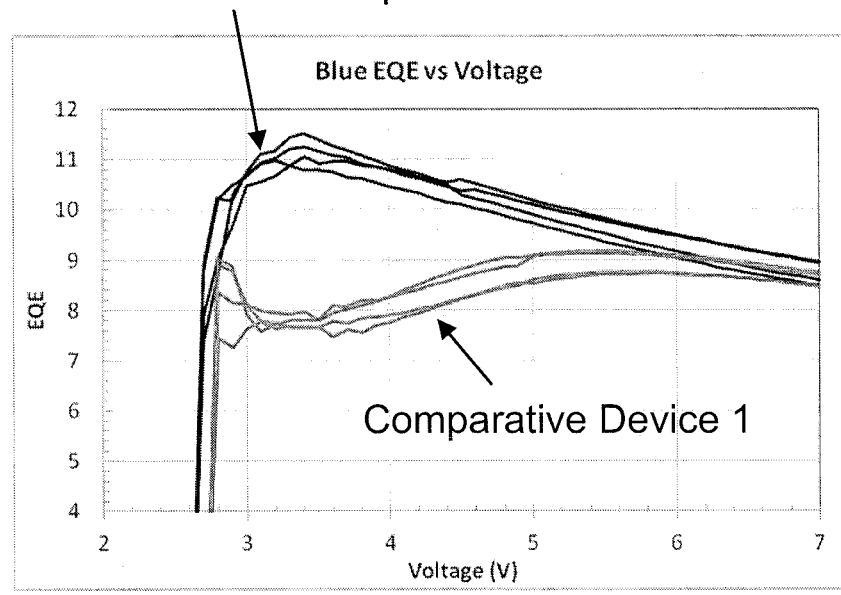
FIG. 2 is a graph of external quantum efficiency vs voltage for a blue fluorescent OLED according to an embodiment of the invention and a comparative device.

With reference to FIG. 2, external quantum efficiency of Device Example 1 is higher than that of Comparative Device 1 across a range of voltages.

Figure 3:
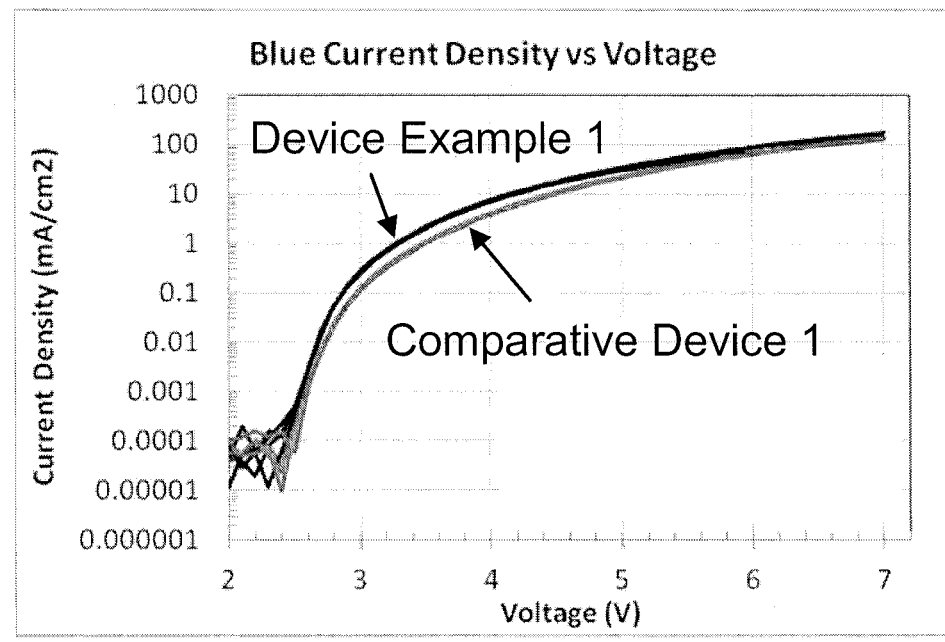
FIG. 3 is a graph of current density vs voltage for a blue fluorescent OLED according to an embodiment of the invention and a comparative device.

With reference to FIG. 3, conductivities of Device Example 1 and Comparative Device 1 are similar.

Figure 4:
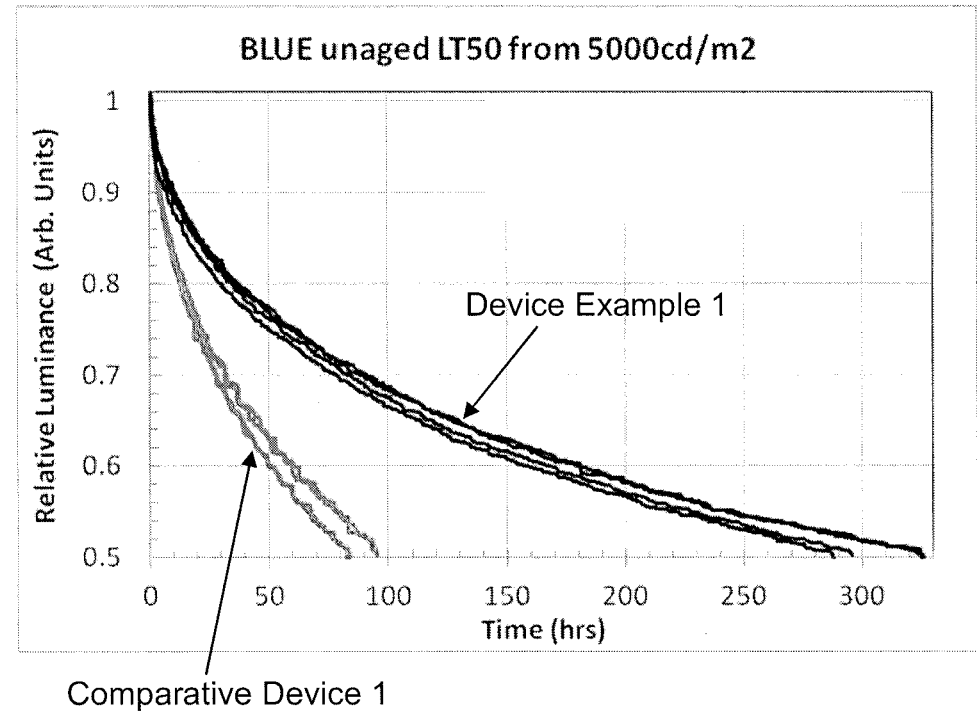
FIG. 4 is a graph of luminance vs. time for a blue fluorescent OLED according to an embodiment of the invention and a comparative device.

With reference to FIG. 4, the time taken for luminance of Device Example 1 to fall by 50% (half life) from a starting luminance of 5,000 cd/m2 is substantially longer than that of Comparative Example 1.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:
1. A polymer comprising repeat units of formula (I) and repeat units of formula (II):

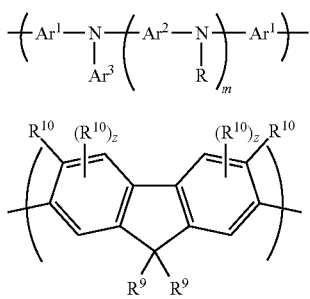

wherein:
Ar[1] and Ar[2] independently in each occurrence represents an aryl or heteroaryl group that may be unsubstituted or substituted with one or more substituents; Ar[3] represents a fused aromatic or heteroaromatic group that may be unsubstituted or substituted with one or more substituents; R is a substituent; m is 0, 1 or 2 with the proviso that Ar[2] is not phenanthrene if m is 1; each R[9] is independently a substituent, and the two groups R[9] may be linked to form a ring; each z is independently 0, 1 or 2; and each R[10] is independently a substituent other than hydrogen.

2. A polymer according to claim 1 wherein m=0.

3. A polymer according to claim 1 wherein Ar[3] is a group of formula (III):

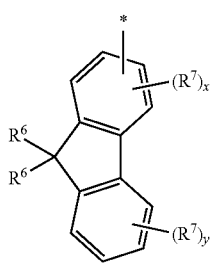

wherein R[6] in each occurrence is independently H or a substituent; R[7] in each occurrence is independently a substituent; x is independently 0, 1, 2 or 3; y is independently 0, 1, 2, 3 or 4; and * represents a point of attachment to the N atom of the repeat unit of formula (I).

4. A polymer according to claim 1 wherein each R[9] is a $C_{1-40}$ hydrocarbyl group.

5. A polymer according to claim 1 wherein each R[10] is a $C_{1-40}$ hydrocarbyl group.

6. A polymer according to claim 1 wherein the polymer comprises one or more further co-repeat units.

7. A polymer according to claim 6 wherein the polymer comprises one or more crosslinkable repeat units.

8. A polymer according to claim 1 wherein the polymer comprises 1-50 mol % of repeat units of formula (I).

9. A polymer according to claim 1 wherein the polymer comprises 1-90 mol % of repeat units of formula (II).

10. A polymer according to claim 1 wherein Ar[1] is phenyl that may be unsubstituted or substituted with one or more substituents.

11. A polymer according to claim 1 wherein m is 1 or 2 and Ar[2] is an aromatic group that may be unsubstituted or substituted with one or more substituents.

12. A polymer according to claim 11 wherein m is 1 or 2 and R is Ar[3].

13. A polymer according to claim 1 wherein m=0.

14. A polymer according to claim 1 wherein z=0.

15. An organic electronic device comprising a layer comprising a polymer according to claim 1.

16. An organic electronic device according to claim 15 wherein the device is an organic light-emitting device comprising an anode, a cathode and a light-emitting layer between the anode and the cathode.

17. An organic electronic device according to claim 16 wherein the layer comprising the polymer is a hole-transporting layer between the light-emitting layer and the anode.

18. An organic electronic device according to claim 16 wherein the light-emitting layer comprises a fluorescent blue light-emitting material.

19. An organic electronic device according to claim 16 wherein the light-emitting layer comprises a phosphorescent light-emitting material.

20. An organic electronic device according to claim 19 wherein the light-emitting layer comprises a green phosphorescent light-emitting material.

21. A polymer according to claim 1 dispersed or dissolved in at least one solvent.

22. A method of forming an organic electronic device according to claim 16, the method comprising the steps of: forming a hole-transporting layer comprising the polymer over the anode, and forming the cathode over the layer,
   wherein the layer comprising the polymer is formed by depositing a formulation comprising the polymer and one or more solvents and evaporating the one or more solvents;
   a light-emitting layer is formed over the hole-transporting layer; and
   the hole-transporting layer is crosslinked prior to formation of the light-emitting layer.

* * * * *